(12) United States Patent
Moore

(10) Patent No.: US 10,545,193 B2
(45) Date of Patent: Jan. 28, 2020

(54) CHARGE PUMP OVERLOAD DETECTION

(71) Applicant: STMicroelectronics (Research & Development) Limited, Marlow (GB)

(72) Inventor: John Kevin Moore, Edinburgh (GB)

(73) Assignee: STMicroelectronics (Research & Development) Limited, Buckinghamshire (GB)

( * ) Notice: Subject to any disclaimer, the term of this patent is extended or adjusted under 35 U.S.C. 154(b) by 479 days.

(21) Appl. No.: 15/209,110

(22) Filed: Jul. 13, 2016

(65) Prior Publication Data

US 2018/0017632 A1    Jan. 18, 2018

(51) Int. Cl.
*G01R 31/40*    (2014.01)
*H02M 3/07*     (2006.01)
*G01R 19/165*   (2006.01)

(52) U.S. Cl.
CPC .......... *G01R 31/40* (2013.01); *G01R 19/165* (2013.01); *H02M 3/07* (2013.01)

(58) Field of Classification Search
CPC ...... G01R 31/40; G01R 31/44; G01R 19/165; H05B 33/08; H02M 1/32; H02M 3/07; H02M 2001/0045; G05F 1/46
USPC ................... 250/214.1; 324/764.01; 381/107
See application file for complete search history.

(56) References Cited

U.S. PATENT DOCUMENTS

| | | | |
|---|---|---|---|
| 2001/0038543 A1* | 11/2001 | Buck | H02M 3/07 363/59 |
| 2011/0233385 A1 | 9/2011 | Dyer | |
| 2012/0163632 A1* | 6/2012 | Lesso | H02M 3/07 381/107 |
| 2013/0153754 A1 | 6/2013 | Drader et al. | |
| 2014/0191115 A1* | 7/2014 | Webster | H01L 31/107 250/214 R |
| 2014/0231630 A1* | 8/2014 | Rae | G01S 17/10 250/214.1 |
| 2015/0115131 A1 | 4/2015 | Webster et al. | |

FOREIGN PATENT DOCUMENTS

| EP | 1 132 725 A2 | 9/2001 |
|---|---|---|
| GB | 2509545 A | 7/2014 |

* cited by examiner

*Primary Examiner* — Farhana A Hoque
(74) *Attorney, Agent, or Firm* — Seed IP Law Group LLP

(57) ABSTRACT

One or more embodiments are directed to charge pump overload detection circuits which may be employed in imaging devices including one or more SPAD arrays, such as proximity sensors and time of flight sensors. One embodiment is directed to a charge pump overload detection circuit that includes a charge pump, a charge pump supply regulation device, a charge pump voltage regulation feedback loop and a charge pump overload detection comparator. The charge pump supplies an output voltage to a load, and the charge pump supply regulation device supplies a regulated voltage to an input of the charge pump. The charge pump voltage regulation feedback loop includes a feedback voltage generator that generates a feedback voltage based on the charge pump output voltage, and an amplifier that generates and provides a charge pump regulation control signal to the charge pump supply regulation device based on a difference between the feedback voltage and a reference voltage. The charge pump overload detection comparator compares the charge pump regulation control signal with a second reference voltage, and outputs an overload signal based on the comparison.

24 Claims, 4 Drawing Sheets

CHARGE PUMP OVERLOAD DETECTION

BACKGROUND

Technical Field

Embodiments of the present disclosure are directed to charge pump overload detection circuits and devices including a charge pump overload detection circuit.

Description of the Related Art

Charge pumps are a kind of DC to DC converter that are used to convert input DC power to an output DC power at a different voltage level. Charge pumps are utilized in a wide variety of electronic circuits and devices, including, for example, ranging devices (such as a time of flight imaging sensor) or proximity sensors.

In a time of flight imaging device, a charge pump may be included to provide a biasing voltage to reverse bias an array of single photon avalanche diodes (SPADs) such that a single photon incident on any SPAD in the array is detectable, as that photon will cause an avalanche which may be detected as an output pulse. However, in relatively high light conditions, many or all of the SPADs in the array may be in an avalanche condition at the same or substantially same time, thus presenting an increased load on the charge pump as the SPADs draw an increased charge from the charge pump. The output voltage of the charge pump thus begins to decrease, which reduces the SPAD sensitivity to incident photons and may result in an incorrect count rate (i.e., a count of incident photons) or other device malfunctions.

BRIEF SUMMARY

The present disclosure is generally directed to systems and methods for detecting a charge pump overload condition. For example, a charge pump may supply a voltage to a load including one or more arrays of single photon avalanche diodes (SPADs). In a high light condition, the SPADs are very active, with many SPADs "firing" (i.e., providing output pulses in response to incident photons) at a high rate, thus making SPAD output pulses very difficult to detect and accurately count. Further, with many SPADs firing at once, the charge pump may become overloaded, thus dropping the charge pump output voltage. When the charge pump output voltage drops too low, the SPADs are no longer properly biased such that an incident photon will cause an avalanche necessary for detection. At that point, the charge pump is said to be collapsed.

In one or more embodiments, a charge pump overload detection circuit is provided that includes a voltage divider coupled to an output of the charge pump, and configured to generate a feedback voltage based on the charge pump output voltage. The feedback voltage is provided to an amplifier, which amplifies a difference between the feedback voltage and a reference voltage. The amplifier output is coupled to a control terminal of a charge pump supply regulation device, which provides a charge pump supply voltage to the input of the charge pump, and the charge pump output voltage is regulated based on the input voltage. The amplifier output is further coupled to an input of an overload detection comparator, which compares the amplifier output (i.e., the voltage at the control terminal of the charge pump supply regulation device) with a second reference voltage. The second reference voltage is set at a voltage such that the comparator detects the point at which the charge pump supply regulation device moves from its high gain saturation region towards its lower gain, linear region, in which case, the comparator outputs an overload signal. Based on the overload signal, one or more SPADs may be disabled, thereby reducing the load on the charge pump, and ensuring proper operation of the SPADs that remain enabled. The charge pump overload detection circuit enables the charge pump and the regulator design to be reduced in area and in power consumption, as the SPADs can be disabled based on the detected charge pump overload condition (thereby reducing power consumption and allowing the charge pump output voltage to rise to a normal operating level).

DETAILED DESCRIPTION

Embodiments are directed to charge pump overload detection circuits which may be employed, for example, in imaging devices including one or more SPAD arrays, such as proximity sensors and time of flight sensors.

Figure 1:
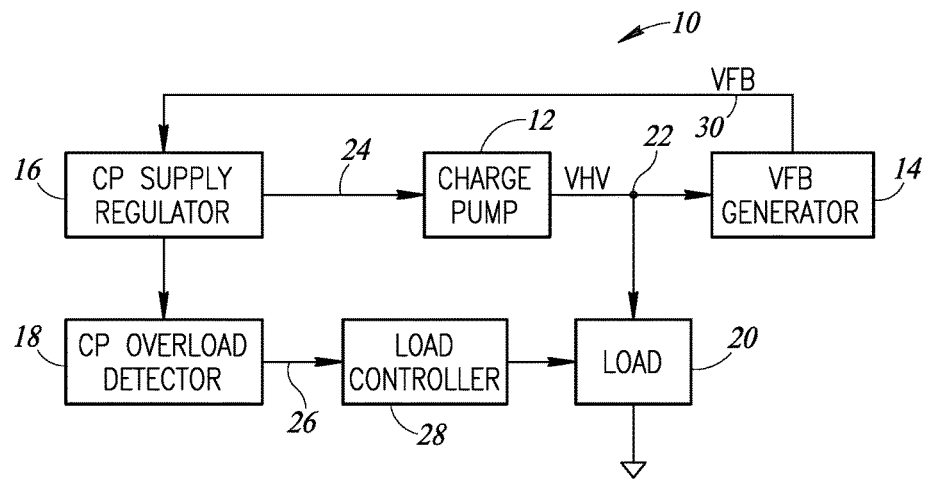
FIG. 1 is a block diagram illustrating a charge pump overload detection circuit, in accordance with an embodiment of the present disclosure.

FIG. 1 is a block diagram illustrating a charge pump overload detection circuit 10, in accordance with one or more embodiments of the present disclosure. The charge pump overload detection circuit 10 may include a charge pump 12, a feedback voltage generator 14, a charge pump supply regulator 16, a charge pump overload detector 18 and a load 20.

The charge pump 12 is coupled to the load 20 and supplies an output voltage 22 (VHV) to the load 20. In one or more embodiments, the load 20 may include a single photon avalanche diode (SPAD) array, and the charge pump overload detection circuit 10 may be utilized, for example, in an imaging device. The output voltage 22 may be, for example, a biasing voltage for reverse biasing each of the SPADs in the array. As such, a single photon impacting any SPAD in the array can cause a self-sustaining avalanche of the particular SPAD, and it may thus be determined that a photon was received by the particular SPAD.

The charge pump overload detection circuit 10 may further include a charge pump supply regulator 16 that is coupled to an input of the charge pump 12. The charge pump supply regulator 16 supplies an input voltage 24 to the charge pump 12, and the charge pump 12 generates the output voltage 22 based on the regulated voltage provided by the charge pump supply regulator 16.

The feedback voltage generator 14 is coupled to the output of the charge pump 12, and detects the output voltage 22 supplied to the load 20 by the charge pump 12. The feedback voltage generator 14 generates a feedback voltage 30 (VFB) based on the detected output voltage 22 of the charge pump 12. The feedback voltage 30 is provided to the charge pump supply regulator 16, which generates the input voltage 24 based on the feedback voltage 30. As noted above, the charge pump output voltage 22 is based on the input voltage 24 (e.g., a scaled or multiplied voltage). Thus, the feedback voltage generator 14 and the charge pump supply regulator 16 form a feedback loop for regulating the output voltage 22 of the charge pump 12, by controlling the input voltage 24 of the charge pump 12.

As will be described in further detail below, the charge pump overload detector 18 is coupled to the charge pump supply regulator 16 and is configured to detect a charge pump overload condition based on a state of the charge pump supply regulator 16. When an overload condition has been detected by the charge pump overload detector 18, the charge pump overload detector may set an overload flag and/or generate an overload signal 26 that is provided to a load controller 28. The load controller 28 may then reduce the load, for example, by disabling one or more load elements in the load 20 (e.g., by disabling one or more SPADs in a SPAD array), thereby enabling the charge pump output voltage 22 to rise to a normal operational level.

Figure 2:
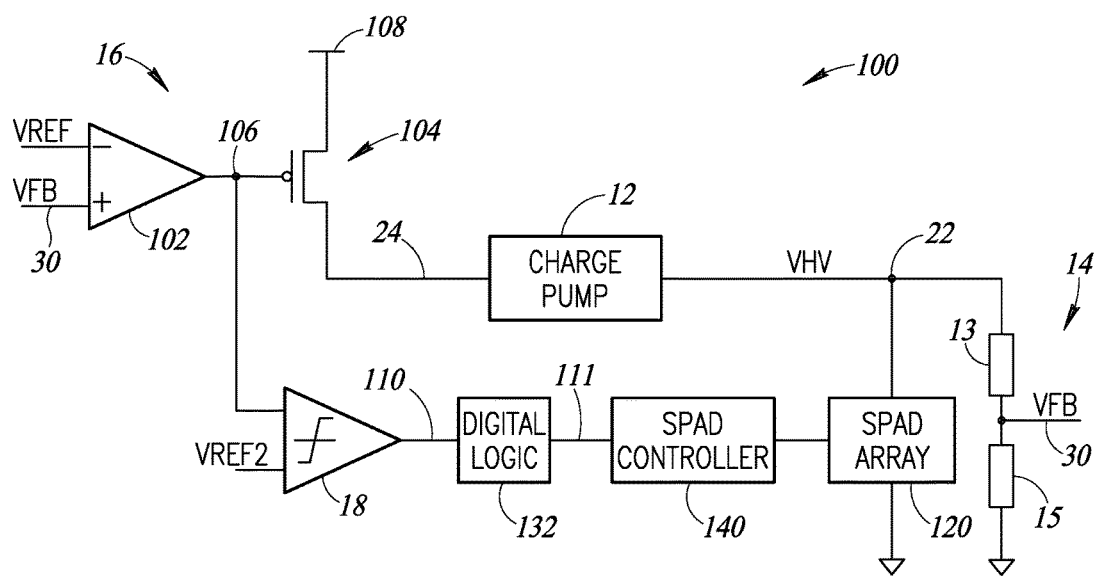
FIG. 2 schematically illustrates a charge pump overload detection circuit, in accordance with another embodiment.

FIG. 2 schematically illustrates a charge pump overload detection circuit 100. The charge pump overload detection circuit 100 is similar to the charge pump overload detection circuit 10 of FIG. 1, but includes further details of the charge pump supply regulator 16, the charge pump overload detector 18 and the feedback voltage generator 14, in accordance with one or more embodiments. The charge pump overload detection circuit 100 of FIG. 2 may be utilized, for example, with a charge pump 12 for supplying a biasing voltage to a SPAD array 120.

In the illustrated embodiment of FIG. 2, the feedback voltage generator 14 includes a voltage divider circuit including a first resistive element 13 and a second resistive element 15 coupled in series between the output voltage 22 of the charge pump 12 and a ground or reference potential. The first and second resistive elements 13, 15 may be any resistor or other electrically resistive elements and may be selected to have electrical resistance values as desired, in order to generate a feedback voltage signal 30 that is a divided, or otherwise scaled, version of the output voltage 22 of the charge pump 12.

As shown in FIG. 2, the charge pump supply regulator 16 includes an amplifier 102 and a charge pump supply regulation device 104. The charge pump supply regulation device 104 supplies the input voltage 24 to the charge pump 12. As shown in FIG. 2, the charge pump supply regulation device 104 may be a transistor coupled between a supply voltage 108 and the charge pump 12. The charge pump supply regulation device 104 is controlled by a charge pump regulation control signal 106 output by the amplifier 102. As noted above, the charge pump supply regulation device 104 may be a transistor. The transistor has a control terminal coupled to the output of the amplifier 102.

The amplifier 102 may be a differential amplifier having first and second input terminals. The amplifier 102 is coupled to a first reference voltage (VREF) at the first input terminal (e.g., an inverting terminal) and to the feedback voltage 30 at the second input terminal (e.g., a non-inverting terminal). The difference between the first reference voltage (VREF) and the feedback voltage 30 is amplified by the amplifier 102, and is provided at the output of the amplifier as a charge pump regulation control signal 106 for controlling the charge pump supply regulation device 104. That is, based on the charge pump regulation control signal 106, the charge pump supply regulation device 104 regulates the input voltage 24 supplied to the charge pump 12.

The charge pump overload detector 18 may be a comparator, as shown in FIG. 2. As shown, the charge pump overload detector 18 receives the charge pump regulation control signal 106 at a first input and compares the charge pump regulation control signal 106 with a second reference voltage (VREF2) received at a second input. The second reference voltage (VREF2) may be set to a fixed voltage value such that the charge pump overload detector 18 detects when the charge pump supply regulation device 104 (e.g., a transistor) moves from a saturation region of operation into a linear region, as will be described in further detail herein. The charge pump overload detector 18 outputs an overload signal 110 when the voltage of the charge pump regulation control signal 106 drops below the second reference voltage (VREF2).

The overload signal 110 is processed by digital logic 132 and provided (as processed overload signal 111) to a SPAD controller 140, which may disable one or more SPADs in the SPAD array 120 based on the detected overload condition, in order to reduce the SPAD load on the charge pump 12.

The digital logic 132 may include known digital sampling circuitry, digital filters, latches or the like, for sampling, filtering or latching the overload signal 110. In one or more embodiments, the digital logic 132 includes a low pass filter and digital sampling circuitry to sample the overload signal 110 on multiple clock edges in order to ensure that the overload signal 110 in fact indicates an overload condition, as opposed to a glitch, for example, in the charge pump regulation control signal 106. Further, the digital logic 132 may optionally include a latch for latching the overload signal 110 or setting a flag indicating the presence of an overload condition.

The digital logic 132 provides the processed overload signal 111 (e.g., the overload signal 110 after processing by the digital logic 132, which may be, for example, a latched flag or signal indicating an overload condition) to the SPAD controller 140. Based on the detected overload condition, the SPAD controller 140 may disable one or more SPADs in the SPAD array 120, thereby reducing the SPAD load on the charge pump 12, and allowing the charge pump 12 to increase its output voltage 22 to a normal operating range.

Figure 3A:
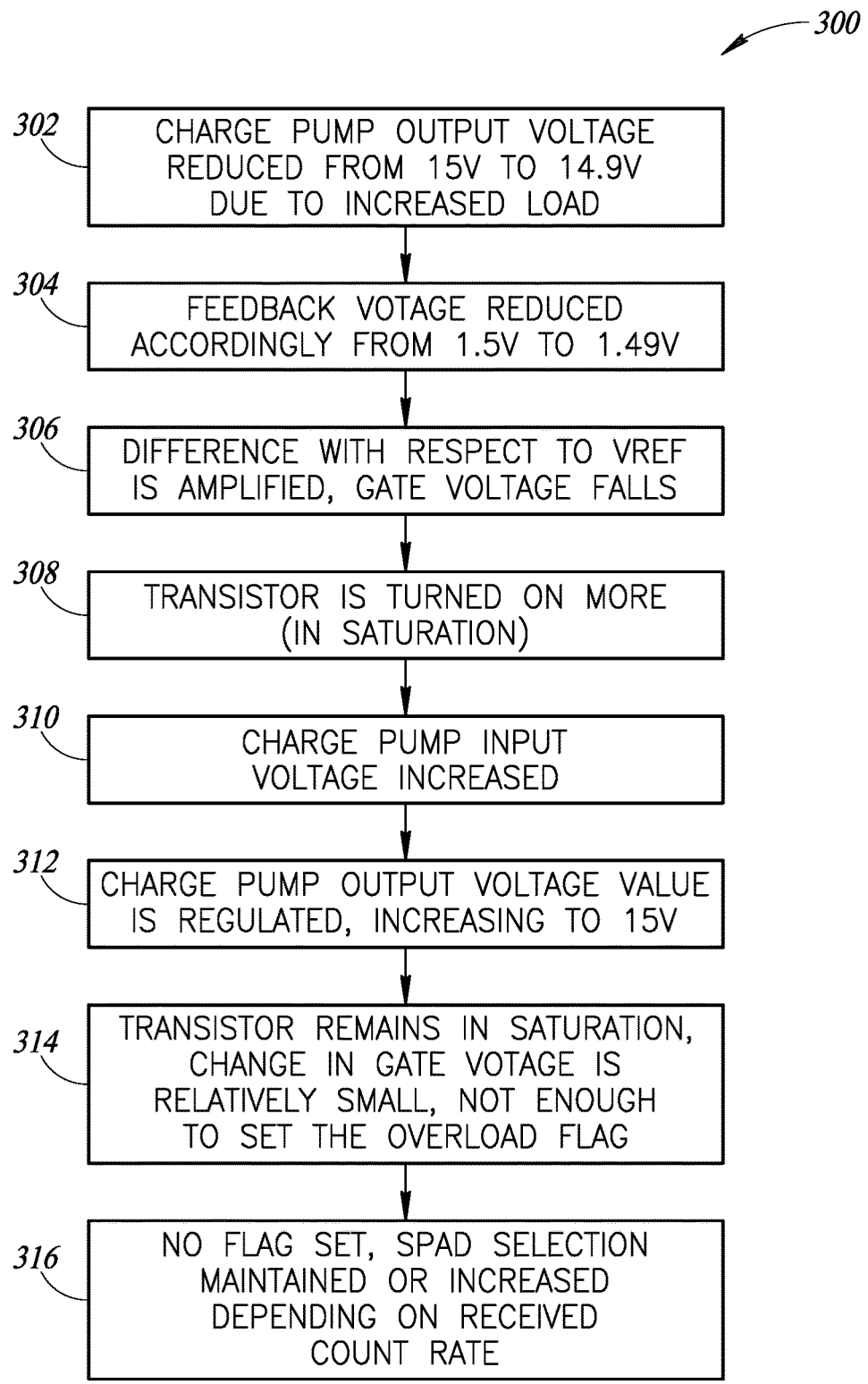
FIGS. 3A and 3B are flowcharts illustrating operation of the charge pump overload detection circuit of FIG. 2 in normal loading and overloaded conditions, respectively.
Figure 3B:
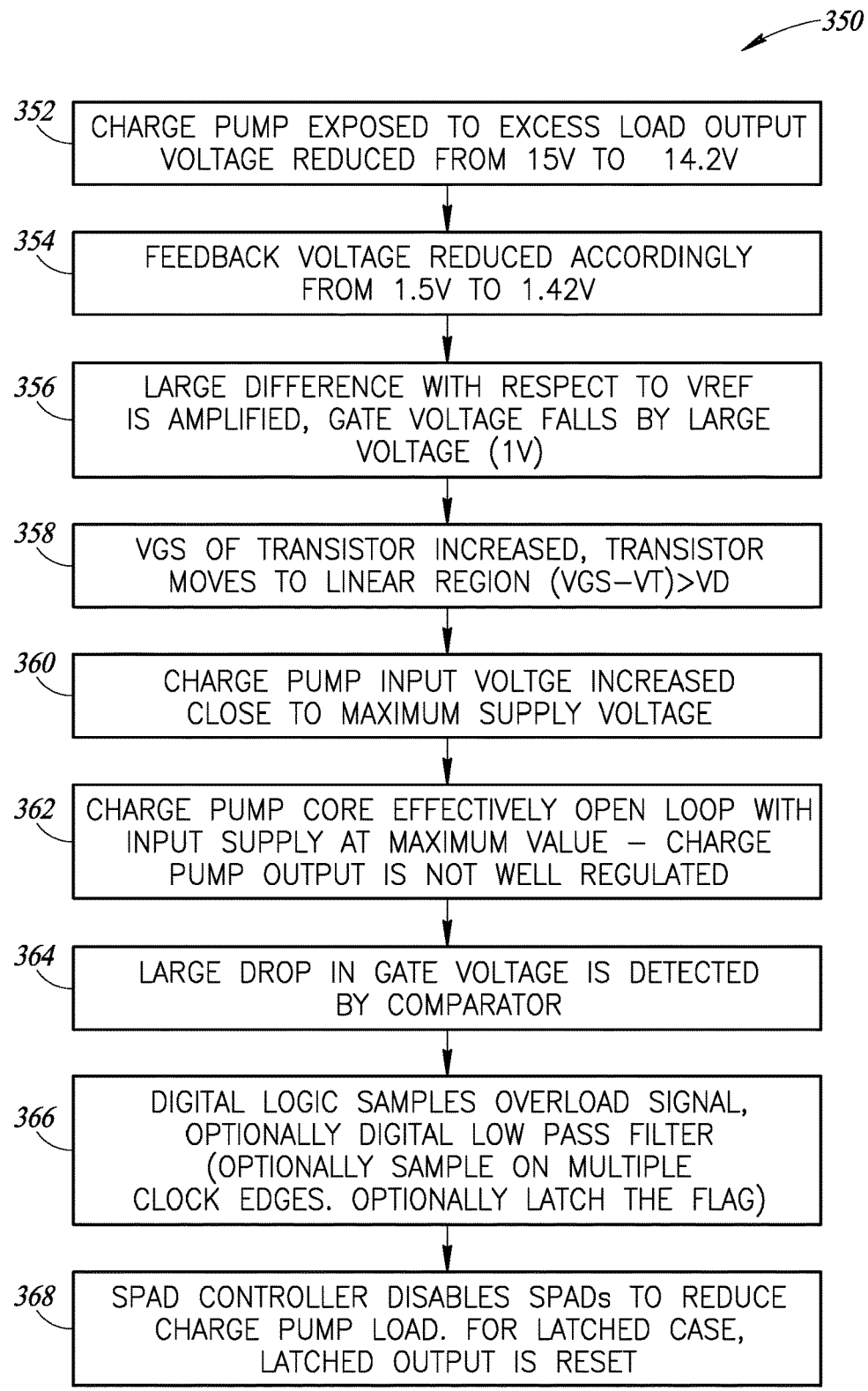

FIGS. 3A and 3B are flowcharts illustrating operation of the charge pump overload detection circuit 100 of FIG. 2 in normal loading and overloaded conditions, respectively.

In the illustrated examples of FIGS. 3A and 3B, the charge pump 12 may have a normal operational output voltage of about 15V. Further, the feedback voltage generator 14 is a voltage divider that scales the output voltage 22 of the charge pump 12 by a factor of 1/10. It will be appreciated that the charge pump 12 may be designed to have any other normal operational output voltage, and the feedback voltage generator 14 may be designed to generate a feedback voltage 30 as any other scaled proportion of the output voltage 22, depending upon application.

During normal operation, the charge pump supply regulation device 104 (i.e., a transistor, as shown in FIG. 2) operates in the saturation mode (i.e., $V_{GS} > V_T$ and $V_{DS} \geq (V_{GS} - V_T)$). Further, during normal operation the SPAD array 120 may present a variable load to the charge pump 12. For example, as incident photons cause an avalanche condition in one or more SPADs in the SPAD array 120, the SPAD array 120 becomes a bigger load and draws an increased charge from the charge pump 12. At block 302 of the flowchart 300 of FIG. 3A, the increased loading of the SPAD array 120 results in a reduction in the output voltage 22 of the charge pump 12, for example, from a normal operational voltage of 15V to a reduced output voltage of 14.9V.

The reduced output voltage, in turn, causes the feedback voltage generator 14 to generate a proportionally reduced feedback voltage 30 (VFB). As shown at block 304, the feedback voltage 30 may be 1/10 of the output voltage 22, and thus is reduced from a normal operational voltage level of 1.5V to 1.49V. The feedback voltage 30 is thus reduced with respect to the fixed first reference voltage (VREF) (which may be, for example, fixed at a value representative of normal loading conditions).

At block 306, the amplifier 30 amplifies and outputs the difference between the first reference voltage (VREF) and the reduced feedback voltage 30 (e.g., 1.49V-1.5V) as the charge pump regulation control signal 106, which results in a decrease in the voltage at the control terminal of the charge pump supply regulation device 104 (i.e., at the gate of the transistor shown in FIG. 2).

At block 308, the reduction in voltage of the charge pump regulation control signal 106 causes the charge pump supply regulation device 104 to be turned on "more" (i.e., the drain-source voltage $V_{DS}$ of the transistor is increased), the transistor remains in the saturation region of operation, and at block 310, the input voltage 24 supplied to the charge pump 12 is increased.

At block 312, the increase in the input voltage 24 causes the charge pump 12 to increase the output voltage 22. The feedback loop (i.e., the loop including the feedback voltage generator 14, the amplifier 102 and the charge pump supply regulation device 104) thus continually regulates the output voltage 22 of the charge pump 12 to a normal operational value (e.g., 15 volts).

At block 314, the transistor remains in the saturation mode of operation and the change in the gate voltage is relatively small. That is, the amplified difference between the first reference voltage (VREF) and the feedback voltage 30 is relatively small, as the output voltage 22 of the charge pump 12 is well-regulated. Accordingly, the charge pump regulation control signal 106 does not fall below the second reference voltage (VREF2), and thus the charge pump overload detector 18 (e.g., the comparator shown in FIG. 2) does not output an overload signal 110 and an overload flag is not set (e.g., by the digital logic 132).

At block 316, because an overload condition was not detected, the SPAD controller 140 maintains the normal operational SPAD selection (i.e., no additional SPADs are disabled) or increases the number of enabled SPADs in the SPAD array 120 (e.g., if one or more SPADs were previously disabled in order to allow the output voltage 22 of the charge pump 12 to increase to a normal level).

FIG. 3B is a flowchart 350 illustrating operation of the charge pump overload detection circuit 100 of FIG. 2 during an overloaded condition, which may be encountered, for example, during high light conditions (i.e., with a high number of photons impacting many or all of the SPADs of the SPAD array 120). Under such conditions, the SPAD array 120 may present a significantly increased load to the charge pump 12, at block 352, which results in a significant reduction in the output voltage 22 of the charge pump 12 (e.g., from a normal operational level of 15V to 14.2V, as shown in the illustrated example).

At block 354, the feedback voltage 30 is reduced accordingly from the normal operational voltage level of 1.5V to 1.42V. At block 356, the amplifier 30 amplifies and outputs the relatively large difference between the first reference voltage (VREF) and the reduced feedback voltage 30 as the charge pump regulation control signal 106, which results in a large decrease in the voltage at the control terminal of the charge pump supply regulation device 104 (i.e., at the gate of the transistor shown in FIG. 2).

At block 358, the decreased value of the charge pump regulation control signal 106 causes the charge pump supply regulation device 104 to move to a linear region of operation (i.e., the gate-source voltage $V_{GS}$ of the transistor is increased such that $(V_{GS}-V_T)>V_{DS}$) in which the voltage at the gate of the transistor falls quickly with increased load current. At block 360, the input voltage 24 supplied to the charge pump 12 is increased to or near a maximum value, close to the supply voltage 108.

At block 362, the charge pump 12 core is effectively in an open loop, with the input voltage 24 at its maximum value. In such a case, the charge pump is said to be "collapsed" and cannot supply a suitably high output voltage 22 for proper functioning of the SPAD array 120. That is, the output voltage 22 (e.g., 14.2V) may not be high enough to properly reverse bias the SPADs in the SPAD array 120, thus reducing SPAD sensitivity and decreasing the likelihood that an incident photon will cause an avalanche in any SPAD of the array such that it can be detected. The feedback loop (i.e., the loop including the feedback voltage generator 14, the amplifier 102 and the charge pump supply regulation device 104) thus cannot properly regulate the output voltage 22 of the charge pump 12 and bring the output voltage 22 back to a normal operational value (e.g., 15 volts).

At block 364, the large drop in voltage of the charge pump regulation control signal 106 (i.e., the voltage at the gate of the transistor) is detected by the charge pump overload detector 18 (e.g., a comparator, as shown in FIG. 2) and compared to the second reference voltage (VREF2). Because the charge pump regulation control signal 106 drops to a level below the second reference voltage (VREF2), the charge pump overload detector 18 outputs an overload signal 110.

At block 366, the digital logic 132 samples the overload signal 110. The digital logic 132 may further process the overload signal 110, such as by filtering the overload signal 110 through a low pass filter. The digital logic 132 may sample the overload signal 110 on multiple clock edges in order to ensure that the overload signal 110 actually indicates an overload condition, as opposed to a glitch. Additionally, the digital logic 132 may optionally include a latch for latching the processed overload signal 110 or setting a flag indicating the presence of an overload condition.

At block 368, the SPAD controller 140 disables one or more SPADs in the SPAD array 120, thereby reducing the total SPAD load on the charge pump 12, until the charge pump 12 can increase its output voltage 22 to a normal operating range. For the case where the digital logic 132 includes a latch for latching an overload flag, the latched output is reset, and the feedback loop continues operating in order to detect any subsequent overload conditions.

Figure 4:
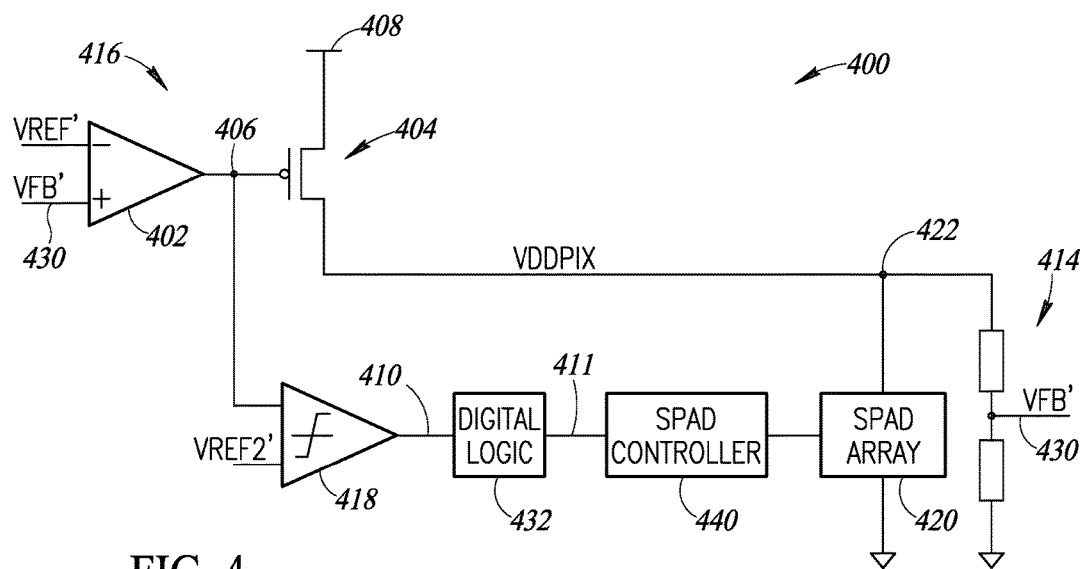
FIG. 4 schematically illustrates an overload detection circuit for detecting an overload condition on a power supply voltage in a readout circuit for a SPAD array, in accordance with another embodiment.

FIG. 4 illustrates an overload detection circuit 400 for detecting an overload condition on a SPAD array power supply voltage (VDDPIX), for example, in a readout circuit for a SPAD array 120. The overload detection circuit 400 is similar to the charge pump overload detection circuit 100 of FIG. 2, but does not include a charge pump. Instead, the power supply voltage (VDDPIX) is provided directly to the SPAD array 420 by way of an output of a supply voltage regulation device, such as a transistor 404. The transistor 404 is coupled between a supply voltage 408 and the SPAD array 420.

A feedback voltage generator 414, which may be a voltage divider circuit that operates in the same manner as the feedback voltage generator 14 of the overload detection circuit 100 shown in FIG. 2, generates a feedback voltage signal 430 (VFB') that is a division of the output voltage 422 (VDDPIX) provided to the SPAD array 420 from the transistor 404.

The overload detection circuit 400 further includes a voltage regulation circuit 416 that includes an amplifier 402 and the supply voltage regulation device, i.e., the transistor 404. The transistor 404 is controlled by a control signal 406 output by the amplifier 402 and coupled to a control terminal of the amplifier 402.

The amplifier 402 may be a differential amplifier that operates analogously to the amplifier 102 of FIG. 2. That is, the amplifier 402 amplifies a difference between a reference voltage (VREF') and the feedback voltage 430 (VFB'), and provides the amplified difference at the output of the amplifier 402 as the control signal 406 for controlling the transistor 404. That is, based on the control signal 406, the transistor 404 regulates the output voltage 422 supplied to the SPAD array 420.

A supply voltage overload detector 418 (such as a comparator, as shown in FIG. 4) receives the control signal 406 at a first input and compares the control signal 406 with a second reference voltage (VREF2') received at a second input. The second reference voltage (VREF2') may be set to a fixed voltage value such that the comparator 418 detects when the transistor 404 moves from a saturation region of operation into a linear region. The supply voltage overload detector 418 outputs an overload signal 410 when the voltage of the control signal 406 exceeds the second reference voltage (VREF2').

The overload signal 410 may be processed by digital logic 432 and provided (e.g., as a processed overload signal 411) to a SPAD controller 440, in the same manner described above with respect to FIG. 2. The SPAD controller 440 may disable one or more SPADs in the SPAD array 420 based on the detected overload condition, in order to reduce the SPAD load and increase the power supply voltage (VDDPIX).

Figure 5:
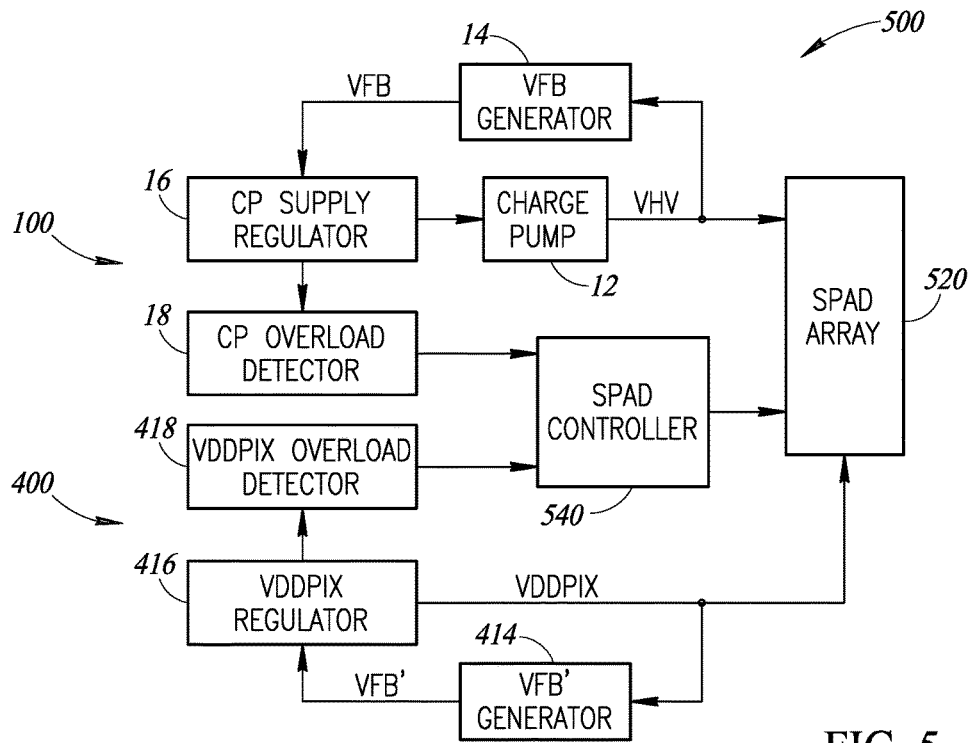
FIG. 5 is a block diagram illustrating an overload detection circuit for an imaging device including a SPAD array, in accordance with another embodiment.

FIG. 5 is a block diagram illustrating an overload detection circuit 500 for an imaging device including a SPAD array 520, in accordance with one or more embodiments. The overload detection circuit 500 may be utilized in an imaging device, such as a time of flight ranging device or proximity sensor. The overload detection circuit 500 includes a charge pump overload detection circuit 100 (e.g., as shown in FIG. 2) and a power supply voltage (e.g., VDDPIX) overload detection circuit 400 (e.g., as shown in FIG. 4).

The charge pump overload detection circuit 100 portion of the overload detection circuit 500 includes a first feedback voltage generator 14, a charge pump supply regulator 16 and a charge pump overload detector 18, the features and functionalities of which are described above with respect to FIG. 2. In particular, the first feedback voltage generator 14 receives the charge pump 12 output voltage (VHV) and generates a first feedback voltage (VFB) that is provided to the charge pump supply regulator 16. The charge pump supply regulator 16 regulates the charge pump 12 input voltage based on the first feedback voltage (VFB), and the charge pump output voltage (VHV) is accordingly regulated. The charge pump overload detector 18 is coupled to the charge pump supply regulator 16 and outputs an overload signal 110 upon detecting a charge pump overload condition, as described above. The SPAD controller 540 is coupled to the charge pump overload detector 18 and is configured to disable one or more SPADs in the SPAD array 520 upon detection of a charge pump overload condition.

The power supply voltage (VDDPIX) overload detection circuit 400 includes a second feedback voltage generator 414, a VDDPIX voltage regulator 416 and a supply voltage overload detector 418, the features and functionalities of which are described above with respect to FIG. 4. In particular, the second feedback voltage generator 414 receives the VDDPIX voltage regulator 416 output voltage (VDDPIX) and provides a second feedback voltage (VFB') to the VDDPIX voltage regulator 416. The VDDPIX voltage regulator 416 regulates the output voltage (VDDPIX) based on the second feedback voltage (VFB'). The supply voltage overload detector 418 is coupled to the VDDPIX voltage regulator 416 and outputs an overload signal 410 upon detecting a supply voltage overload condition, as described above. The SPAD controller 540 is coupled to the supply voltage overload detector 418 and disables one or more SPADs in the SPAD array 520 upon detection of a supply voltage overload condition.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A charge pump overload detection circuit, comprising:
a charge pump having a supply input and a first output being configured to supply an output voltage from the first output to a load;
a charge pump supply regulation device configured to receive a charge pump regulation control signal, having an input for receiving a supply voltage, and having a second output coupled to the supply input, and configured to regulate the supply voltage to supply a regulated voltage from the second output to the supply input of the charge pump based on the charge pump regulation control signal;
a comparator having a first input coupled to the charge pump supply regulation device, having a second input that receives an overload reference voltage, and configured to receive the charge pump regulation control signal and to compare the charge pump regulation control signal with the overload reference voltage, and to output an overload signal based on the comparison; and
a controller coupled to receive the overload signal and to control the load based on the overload signal.

2. The charge pump overload detection circuit of claim 1, further comprising a charge pump voltage regulation feedback loop including:
a feedback voltage generator configured to detect the output voltage from the charge pump and to generate a feedback voltage based on the detected output voltage, and
an amplifier having first and second input terminals, the first input terminal being configured to receive a charge pump regulation reference voltage, the second input terminal being configured to receive the feedback voltage, the amplifier being configured to generate and provide the charge pump regulation control signal to the charge pump supply regulation device.

3. The charge pump overload detection circuit of claim 2, wherein the feedback voltage generator includes a voltage divider circuit.

4. The charge pump overload detection circuit of claim 2, wherein the charge pump supply regulation device includes a transistor having a control terminal configured to receive the charge pump regulation control signal.

5. The charge pump overload detection circuit of claim 4, wherein the overload reference voltage is set at a value such that the comparator is configured to output the overload signal when the transistor moves from a saturation operating mode to a linear operating mode.

6. The charge pump overload detection circuit of claim 1, wherein the load includes a single photon avalanche diode (SPAD) array.

7. The charge pump overload detection circuit of claim 1, further comprising a SPAD controller coupled to the SPAD array and configured to disable one or more SPADs in the SPAD array based on the overload signal.

8. The charge pump overload detection circuit of claim 1, further comprising digital logic coupled to the comparator and configured to sample the overload signal.

9. The charge pump overload detection circuit of claim 8, wherein the digital logic is further configured to latch the overload signal.

10. An imaging device, comprising:
an array of single photon avalanche diodes (SPADs);
a charge pump having an output coupled to the array of SPADs and configured to supply at the charge pump output a biasing voltage to the array of SPADs;
a charge pump voltage regulator configured to supply a regulated voltage to an input of the charge pump;
a charge pump voltage regulation feedback loop including:
a first feedback voltage generator configured to detect the biasing voltage output from the charge pump and to generate a first feedback voltage based on the detected output voltage, and
a first amplifier having first and second input terminals, the first input terminal being configured to receive a first reference voltage, the second input terminal being configured to receive the first feedback voltage, the first amplifier being configured to generate and provide a charge pump regulation control signal to the charge pump supply regulation device;
a charge pump overload detection comparator configured to compare the charge pump regulation control signal with a second reference voltage, and to output a charge pump overload signal based on the comparison; and
a SPAD controller coupled to the SPAD array and configured to disable one or more SPADs in the SPAD array based on the charge pump overload signal.

11. The imaging device of claim 10, wherein the first feedback voltage generator includes a first voltage divider circuit.

12. The imaging device of claim 10, wherein the charge pump voltage regulator includes a first transistor having a control terminal configured to receive the charge pump regulation control signal.

13. The imaging device of claim 12, wherein the second reference voltage is set at a value such that the charge pump overload detection comparator is configured to output the charge pump overload signal when the first transistor moves from a saturation operating mode to a linear operating mode.

14. The imaging device of claim 13, further comprising:
a second transistor having an output coupled to the array of SPADs and configured to provide a readout supply voltage to the array of SPADs;
a supply voltage regulation feedback loop including:
a second feedback voltage generator configured to detect the readout supply voltage output from the second transistor and to generate a second feedback voltage based on the detected output voltage, and
a second amplifier having first and second input terminals, the first input terminal being configured to receive a third reference voltage, the second input terminal being configured to receive the second feedback voltage, the second amplifier being configured to generate and provide a supply voltage regulation control signal to a control terminal of the second transistor; and
a supply voltage overload detection comparator configured to compare the supply voltage regulation control signal with a fourth reference voltage, and to output a supply voltage overload signal based on the comparison,
wherein the SPAD controller is further configured to disable one or more SPADs in the SPAD array based on the supply voltage overload signal.

15. The imaging device of claim 14, wherein the second feedback voltage generator includes a second voltage divider circuit.

16. The imaging device of claim 14, wherein the fourth reference voltage is set at a value such that the supply voltage overload detection comparator is configured to output the supply voltage overload signal when the second transistor moves from a saturation operating mode to a linear operating mode.

17. A method, comprising:
providing a charge pump output voltage to a single photon avalanche diode (SPAD) array;
detecting the charge pump output voltage and generating a first feedback voltage based on the detected charge pump output voltage;
generating a charge pump regulation control signal by amplifying a difference between the first feedback voltage and a first reference voltage;
regulating the charge pump output voltage by controlling a charge pump supply regulation device based on the charge pump regulation control signal;
comparing the charge pump regulation control signal with a second reference voltage; and
outputting a charge pump overload signal based on the comparison.

18. The method of claim 17, further comprising:
disabling one or more SPADs in the SPAD array based on the charge pump overload signal.

19. The method of claim 17, wherein the charge pump supply regulation device includes a first transistor and outputting the charge pump overload signal includes outputting the overload signal when the first transistor moves from a saturation operating mode to a linear operating mode.

20. The method of claim 19, further comprising:
providing a readout supply voltage from a second transistor to the SPAD array;
detecting the readout supply voltage and generating a second feedback voltage based on the detected readout supply voltage;
generating a supply voltage regulation control signal by amplifying a difference between the second feedback voltage and a third reference voltage;

regulating the readout supply voltage by controlling the second transistor based on the supply voltage regulation control signal;

comparing the supply voltage regulation control signal with a fourth reference voltage; and outputting a supply voltage overload signal based on the comparison.

21. The method of claim 20, further comprising:

disabling one or more SPADs in the SPAD array based on the supply voltage overload signal.

22. An overload detection circuit, comprising:

a voltage regulator coupled between a power supply voltage and a load, the voltage regulator being configured to receive a voltage regulation control signal and to output a regulated voltage to the load based on the voltage regulation control signal;

a comparator configured to detect the voltage regulation control signal, compare the voltage regulation control signal with an overload reference voltage and to output an overload signal based on the comparison; and a voltage regulation feedback loop including:

a feedback voltage generator configured to detect the output voltage from the voltage regulator and to generate a feedback voltage based on the detected output voltage, and an amplifier having first and second input terminals, the first input terminal being configured to receive a voltage regulation reference voltage, the second input terminal being configured to receive the feedback voltage, the amplifier being configured to generate and provide the voltage regulation control signal to the voltage regulator.

23. The overload detection circuit of claim 22, wherein the voltage regulator includes a transistor having a control terminal configured to receive the voltage regulation control signal.

24. The overload detection circuit of claim 23, wherein the overload reference voltage is set at a value such that the comparator is configured to output the overload signal when the transistor moves from a saturation operating mode to a linear operating mode.

* * * * *